United States Patent
Hintermaier et al.

(10) Patent No.: US 6,350,643 B1
(45) Date of Patent: *Feb. 26, 2002

(54) REDUCED DEGRADATION OF METAL OXIDE CERAMIC DUE TO DIFFUSION OF A MOBILE SPECIE THEREFROM

(75) Inventors: Frank S. Hintermaier, Munich (DE); Jeffrey F. Roeder, Brookfield, CT (US); Bryan C. Hendrix, Danbury, CT (US); Debra A. Desrochers, Brookfield, CT (US); Thomas H. Baum, New Fairfield, CT (US)

(73) Assignees: Advanced Technology Materials, Inc., Danbury, CT (US); Infineon Technologies Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/216,370

(22) Filed: Dec. 18, 1998

Related U.S. Application Data

(63) Continuation-in-part of application No. 09/107,861, filed on Jun. 30, 1998, now Pat. No. 6,133,051.
(60) Provisional application No. 60/068,040, filed on Dec. 18, 1997.

(51) Int. Cl.$^7$ ...................... H01L 21/8242; H01L 21/20
(52) U.S. Cl. ...................... 438/240; 438/253; 438/396
(58) Field of Search ............................... 438/473, 2, 3, 438/104, 396, 476, 914, 919, 922, 223, 924

(56) References Cited

U.S. PATENT DOCUMENTS

| | | | |
|---|---|---|---|
| 5,047,390 A | * | 9/1991 | Higashino et al. .......... 505/190 |
| 5,440,161 A | * | 8/1995 | Iwamatsu et al. ............ 257/349 |
| 5,519,566 A | * | 5/1996 | Perino et al. ............. 361/321.4 |
| 5,527,567 A | | 6/1996 | Desu et al. .................. 427/573 |
| 5,701,647 A | * | 12/1997 | Saenger et al. ............. 438/395 |
| 5,831,299 A | * | 11/1998 | Yokoyama et al. ......... 257/295 |
| 5,834,804 A | * | 12/1998 | Hwang et al. .............. 257/295 |
| 5,859,274 A | | 1/1999 | Baum et al. .................. 556/76 |
| 5,885,648 A | * | 3/1999 | Dougherty et al. ............ 427/8 |

FOREIGN PATENT DOCUMENTS

| | | | |
|---|---|---|---|
| JP | 362193156 | * | 8/1987 |
| NL | 003149788 | * | 6/1983 |

OTHER PUBLICATIONS

Zhu et al., "SrBi2Ta2O9 thin films made by liquid source metal–organic chemical vapor deposition", Mater. Res., 12(1997) p. 783.*
William S. Rees, Jr., Editor, Rees, "CVD of nonmetals" (1996) ISBN 3-527-29295-0.
U.S. application No. 09/107,861, Hintermaier et al.
U.S. application No. 08/975,087, Hintermaier et al.
Xu, "Ferroelectric Materials and their applications", North Holland (1991) pp. 101–215.
Zhu et al., "SrBi2Ta2O9 thin films made by liquid source metal–organic chemical vapor deposition", Mater. Res., 12(1997) p. 783.
M. Ushikubo, et al., "Low Temperature Growth of sol–gel SrBi2Ta2O9 thin films by low pressure annealing", Integrated Ferroelectrics, 1997, vol. 14, pp. 123–131.

(List continued on next page.)

Primary Examiner—Jerome Jackson, Jr.
Assistant Examiner—Paul E. Brock, II
(74) Attorney, Agent, or Firm—Marianna Fuierer; Margaret M. Chappuis

(57) ABSTRACT

Reduced diffusion of excess mobile specie from a metal oxide ceramic is achieved by tailoring the composition an/or deposition parameters. A barrier layer which reacts with the excess mobile specie is provided below the metal oxide ceramic to prevent or reduce the diffusion of the excess mobile specie through the bottom electrode and into the substrate.

26 Claims, 5 Drawing Sheets

OTHER PUBLICATIONS

Budd et al, "Sol–gel processing of lead titanate (PbTiO$_3$), lead zirconate (PbZrO$_3$), PZT and PLZT thin films" Brit. Ceram. Soc. Proc., vol. 36, p. 107, 1985.

Brierley et al., "The growth of ferroelectric oxides by MOCVD" Ferroelectrics, vol. 91, p. 181, 1989.

Takayama et al., "Preparation of epitaxial Pb(ZrxTi1–x)O3 thin films and their cystallographic, pyroelectric, and ferroelectric properties" J. Appl. Phys., vol. 65, 1989, p. 1666.

Hideo Kidoh et al., "Preparation of Pb(Zr,Ti)O3 Films on Si Substrate by Laser Ablation" Jpn. J. Appl. Phys., vol. 31, 1992, pp. 2965–2967.

* cited by examiner

REDUCED DEGRADATION OF METAL OXIDE CERAMIC DUE TO DIFFUSION OF A MOBILE SPECIE THEREFROM

This application is a continuation in-part of U.S. patent application Ser. No. 09/107,861 filed Jun. 30, 1998, entitled "Amorphously Deposited Metal Oxide Ceramic Films", now U.S. Pat. No. 6,133,051.

This application claims the priority of provisional application U.S. Serial No. 60/068,040,which was filed on Dec. 18, 1997.

FIELD OF THE INVENTION

The invention relates generally to metal oxide ceramic films used in integrated circuits (ICs). More particularly, the invention relates to reducing or counteracting degradation of the metal oxide ceramic due to excessive loss of a mobile specie from the film.

BACKGROUND OF THE INVENTION

Metal oxide ceramic materials have been investigated for their use in ICs. For example, metal oxide ceramics that are ferroelectrics or are capable of being transformed into ferroelectrics are useful due to their high remanant polarization (2Pr) and reliable long-term storage characteristics.

Various techniques, such as sol-gel, chemical vapor deposition (CVD), sputtering, or pulsed laser deposition (PLD), have been developed for depositing ferroelectric films on a substrate. Such techniques, for example, are described, for example, Budd et al., Brit. Ceram. Soc. Proc., 36, p107 (1985); Brierley et al., Ferroelectrics, 91, p181 (1989), Takayama et al., J. Appl. Phys., 65, p1666 (1989); Morimoto et al., J. Jap. Appl. Phys. 318, 9296 (1992); and co-pending United States Patent Applications U.S. Ser. No. 08/975,087, titled "Low Temperature CVD Process using B-Diketonate Bismuth Precursor for the Preparation of Bismuth Ceramic Thin Films for Integration into Ferroelectric Memory Devices," U.S. Ser. No. 09/107,861, titled "Amorphously Deposited Metal Oxide Ceramic Films," all of which are herein incorporated by reference for all purposes.

Metal oxide ceramics are often treated with a post-deposition thermal process at a relatively high temperature in order to produce resulting materials with the desired electrical characteristics. For example, some Bi-based oxide ceramics such as strontium bismuth tantalate (SBT) are thermally treated by a "ferroanneal." The ferroanneal converts the as-deposited films into the ferroelectric phase. After the as-deposited films are converted into the ferroelectric phase, the ferroanneal continues, growing the grain size (e.g., greater than about 180 nm) of the films in order to achieve a good remanent polarization. Other types of metal oxide ceramics can be deposited as ferroelectrics. For example, lead zirconium titanate (PZT) is often deposited at a relatively higher temperature, such as greater than 500° C., to form an as-deposited film with a ferroelectric perovskite phase. Although the PZT is deposited as a ferroelectric, a post-deposition thermal process is often still needed to improve its electrical characteristics.

Typically, the metal oxide ceramics comprise a mobile specie. The high temperature of the post-deposition heat treatment causes diffusion of the mobile specie out of the metal oxide ceramic layer. The amount of mobile specie that diffuses out of the metal oxide ceramic layer is referred to as an "excess mobile specie." The mobile specie can be in the form of atoms, molecules, or compounds. Diffusion of the excess mobile specie can result in a metal oxide ceramic having an incorrect stoichiometry. This can have a detrimental effect on the electrical properties, such as remanent polarization (2Pr) and leakage current, because they depend highly on the material composition.

Additionally, the diffusion of the excess mobile specie can have an adverse impact on yields. The excess mobile specie can easily migrate through the bottom electrode and into other regions of the IC during the post deposition heat treatment, which can cause shorts and/or alter the electrical properties of other device regions such as the diffusion regions.

As evidenced by the foregoing discussion, it is desirable to counteract the adverse effects caused by diffusion of an excess mobile specie from a metal oxide ceramic layer.

SUMMARY OF THE INVENTION

The invention relates to metal oxide ceramic films and their applications in ICs. More particularly, the invention relates to reducing the degradation of metal oxide ceramic due to the diffusion of an excess mobile specie.

In accordance with one aspect of the invention, degradation of the metal oxide ceramic due to diffusion of the mobile specie is reduced. In one embodiment, a compensation layer is provided beneath the metal oxide ceramic. The compensation layer comprises the mobile specie to compensate the metal oxide ceramic for the loss of the excess mobile specie due to diffusion during the post-deposition heat treatment. The mobile specie from the compensation layer migrates to the metal oxide ceramic, replenishing it with the mobile specie to ensure that the metal oxide comprises the correct or desired stoichiometry to achieve good electrical properties.

In another embodiment, the compensation layer comprises a material that facilitates the formation of the desired phase in the metal oxide ceramic layer during the post-deposition heat treatment. Forming the desired phase in the metal oxide ceramic reduces the degradation of the metal oxide ceramic due to diffusion of the mobile specie. In one embodiment, the compensation layer facilitates the formation of a ferroelectric phase in the metal oxide ceramic layer during the post-deposition heat treatment.

In yet another embodiment, the stoichiometry or composition of the metal oxide ceramic is selected to reduce or minimize diffusion of the mobile specie without adversely affecting the electrical properties of the material. Additionally, the deposition parameters of the metal oxide ceramic can be controlled to reduce the diffusion of the excess mobile specie from the metal oxide ceramic. In one embodiment, the ratio of oxidizer to the precursor is reduced to reduce diffusion of the mobile specie.

In another aspect of the invention, diffusion of the excess mobile specie through the bottom electrode and into the substrate below is reduced. In one embodiment a barrier layer is provided below the metal oxide ceramic. The barrier layer reacts with the mobile specie during the post deposition heat treatment. The reaction consumes the mobile specie, preventing it from diffusing through the electrode. The barrier layer can also serve as a compensation layer to facilitate formation of the desired phase in the metal oxide ceramic.

In another embodiment, the diffusion pathway along the grain boundaries of the conductive layer on which the metal oxide ceramic is formed (e.g., bottom electrode) is blocked to reduce the diffusion of the mobile specie into unwanted regions of the device. In one embodiment, the conductive layer comprises a material that oxidizes during the post-deposition heat treatment. The formed oxide either segregates from the conductive material and fills the gaps between grain boundaries of the electrode or is integrated with the conductive material to change the chemical nature of the metal oxide ceramic/conductive layer interface to prevent the mobile specie from diffusing through. Preferably, the oxide molecules react with the mobile specie to trap it in the conductive layer. The conductive material can also prevent the migration of oxygen into unwanted regions of the device.

DETAILED DESCRIPTION OF THE INVENTION

The invention relates to metal oxide ceramic films and their applications in ICs. More particularly, the invention relates to reducing the adverse effects resulting from diffusion of an excess mobile specie from a metal oxide ceramic. For purposes of illustration, the invention is described in the context of a ferroelectric memory cell. However, the invention is applicable to the formation of metal oxide ceramics in general.

Figure 1:
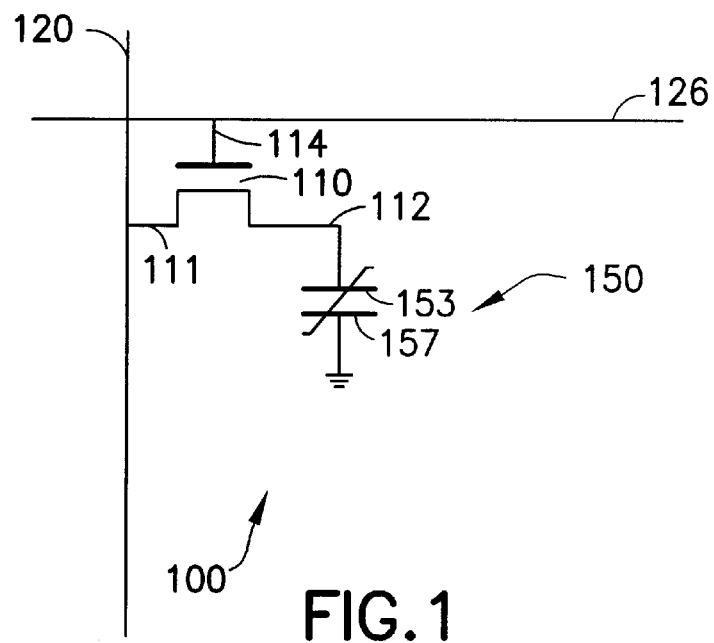
FIG. 1 shows a schematic diagram of an illustrative embodiment of the invention.

Referring to FIG. 1, a schematic diagram of a ferroelectric memory cell 100 is shown. As shown, the memory cell comprises a transistor 110 and a ferroelectric capacitor 150. A first electrode 111 of the transistor is coupled to the bitline 125, and a second electrode 112 is coupled to the capacitor. A gate electrode of the transistor is coupled to the wordline 126.

The ferroelectric capacitor comprises first and second plates 153 and 157 separated by a ferroelectric layer 155. The first plate 153 is coupled to the second electrode of the transistor. The second plate typically serves as a common plate in the memory array.

A plurality of memory cells is interconnected with wordlines and bitlines to form an array in a memory IC. Access to the memory cell is achieved by providing the appropriate voltages to the wordline and bitline, enabling data to be written or read from the capacitor.

Figure 2:
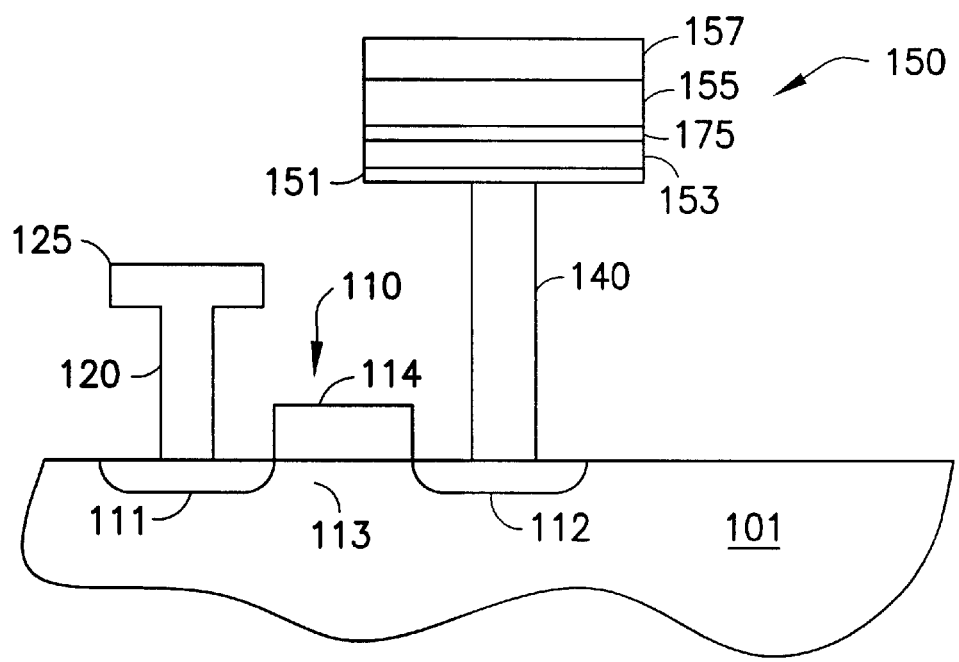
FIG. 2 shows a cross-sectional view of one embodiment of the invention.

Referring to FIG. 2, a cross-section of a ferroelectric memory cell 100 in accordance with one embodiment of the invention is shown. The memory cell comprises a transistor 110 on a substrate 101 such as a semiconductor wafer. The transistor includes diffusion regions 111 and 112 separated by a channel 113, above which is located a gate 114. A gate oxide (not shown) separates the gate from the channel. The diffusion regions comprise dopants which are p-type or n-type. The type of dopants chosen is dependent upon the type of transistor desired. For example, n-type dopants such as arsenic (As) or phosphorus (P) are used for n-channel devices, and p-type dopants such as boron (B) are used for p-channel devices. Depending on the direction of current flow between the diffusion regions, one is referred to as the "drain" and the other the "source." The terms "drain" and "source" are herein used interchangeably to refer to the diffusion regions. Typically, the current flows from the source to drain. The gate represents a wordline, and one of the diffusion regions 111 is coupled to a bitline by a contact plug 120.

A capacitor 150 is coupled to diffusion region 112 via a contact plug 140. The capacitor comprises bottom and top electrodes 153 and 157 separated by a metal oxide ceramic layer 155. The metal ceramic layer, in one embodiment, comprises a ferroelectric phase or is capable of transformation into a ferroelectric. The electrodes comprise a conductive material.

In one embodiment, the composition or stoichiometry of the metal oxide ceramic layer is tailored to cause a reduction in the amount of the excess mobile specie diffusing therefrom. By reducing the diffusion of excess mobile specie, the metal oxide maintains a correct composition to achieve good electrical properties. In addition, reducing the amount of diffusion of the excess mobile specie would reduce the destruction of the lower parts of the substrate.

Additionally, the deposition parameters of the metal oxide ceramic can be controlled to reduce diffusion of the excess mobile specie from the metal oxide ceramic. In one embodiment, the ratio of oxidizer to the precursor amount of oxidizer is reduced to reduce diffusion of the excess mobile specie.

In another embodiment, a compensation layer 175 is provided to reduce degradation of the metal oxide ceramic layer 155. The compensation layer is provided below the metal oxide ceramic layer 155. In one embodiment, the compensation layer comprises a material which includes atoms or molecules comprising the mobile specie. During the post-deposition heat-treatment, the mobile specie from the compensation layer migrates to the metal oxide ceramic to compensate for the loss of mobile specie due to diffusion. This ensures that the metal oxide ceramic layer comprises a correct stoichiometry to achieve good electrical properties such as high 2Pr.

Alternatively, the compensation layer 175 serves as a seed layer to facilitate the formation of the desired phase in the metal oxide ceramic layer. In one embodiment, the compensation layer serves as a seed layer to facilitate the formation of the ferroelectric phase in the metal oxide ceramic layer. Segregation and the formation of other undesirable phases during the post-deposition heat treatment is reduced by facilitating the formation of the desired ferroelectric phase, which enhances the metal oxide layer's ferroelectric properties (e.g., high 2Pr).

In another embodiment, a barrier layer (not shown) is provided above the bottom electrode 153. The barrier layer can be, for example, located between the bottom electrode 153 and the compensation layer 175 or the metal oxide ceramic layer 155. The barrier layer 151 reacts with the excess mobile specie, consuming the excess mobile specie that diffuses from the metal oxide ceramic. The reaction can also cause the barrier layer to become dense, thereby preventing further diffusion of the excess mobile specie through it. After the reaction, the resulting barrier layer preferably comprises paraelectric or ferroelectric properties in order to reduce or minimize its effect on the electric field applied to the ferroelectric layer 155.

In yet another embodiment, diffusion of the mobile specie into the substrate is reduced by blocking the diffusion pathway along the grain boundaries of the layer on which the metal oxide ceramic is formed (e.g., bottom electrode). In one embodiment, the diffusion pathway along the grain boundaries of the bottom electrode is blocked by forming a bottom electrode with a conductive material that oxidizes during the post-deposition heat treatment. The formed oxide can segregate from the base electrode material and fill the gaps between the grain boundaries, blocking the diffusion pathway of the excess mobile specie. Also, the oxide can be integrated into the base electrode material, forming fully or highly miscible material which reacts with the excess mobile specie, trapping it in the bottom electrode. The reaction preferably increases the denseness of the bottom electrode to prevent further diffusion of the excess mobile specie through it.

An interlevel dielectric (ILD) layer 160 is provided to isolate the different components of the memory cell. The ILD layer comprises, for example, silicate glass such as silicon dioxide ($SiO_2$) or silicon nitride ($Si_3N_4$). Doped silicate glass such as borophosphosilicate glass (BPSG), borosilicate glass (BSG), or phosphosilicate glass (PSG) are also useful. Other types of dielectric materials can also be used.

The different aspects of the invention can be used alone or in combination to reduce degradation of the metal oxide ceramic and/or diffusion of the excess mobile specie into unwanted regions of the device. Likewise, the various embodiments of the different aspects can be used alone or in combination.

Figure 3A:
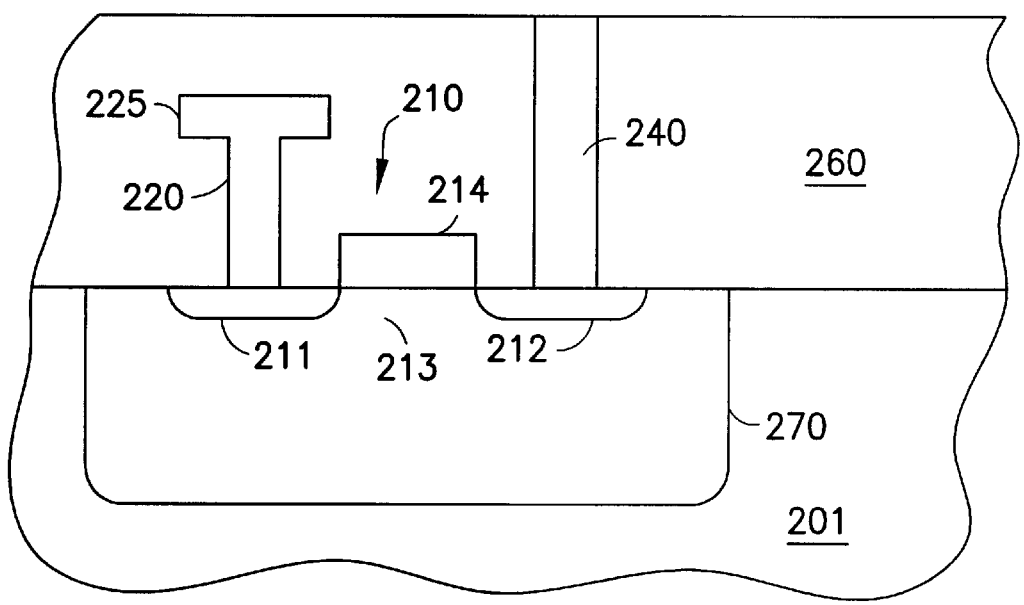
FIGS. 3a–c show a process for forming a device in accordance with one embodiment of the invention.
Figure 3B:
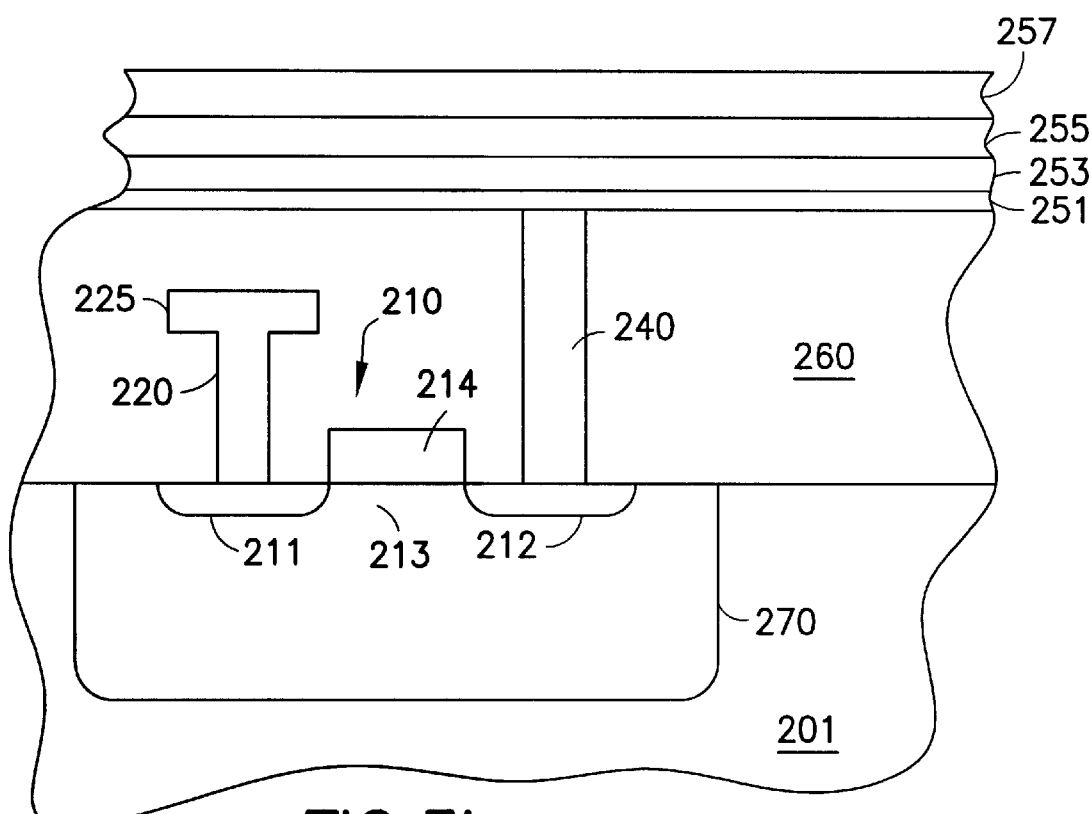

The memory cell is formed by a process sequence described in FIGS. 3a–b. Referring to FIG. 3a, a substrate 201 comprising a partially formed device is shown. As shown, the substrate includes a transistor 210. The substrate, for example, is a semiconductor wafer comprising silicon. Other types of substrates such as germanium (Ge), gallium arsenide (GaAs), or other semiconductor compounds can also be used. Typically, the substrate is lightly doped with p-type dopants such as B. More heavily doped substrates are also useful. A heavily doped substrate with a lightly doped epitaxial (epi) layer such as a p−/p+ substrate can also be used. N-type doped substrates, including lightly doped, heavily doped, or heavily doped substrates with a lightly doped epi layer, are also useful.

A doped well 270 comprising dopants, if necessary, is provided to prevent punchthrough. The doped well is formed by selectively implanting dopants into the substrate in the region where the transistor is formed. In one embodiment, the doped well is formed by implanting p-type dopants such as B into the substrate. The p-type doped well (p-well) serves as a doped well for n-channel devices. The use of an n-type doped well (n-well) comprising, for example, As or P dopants is also useful for p-channel devices.

Diffusion regions 211 and 212 are formed by selectively implanting dopants having a second electrical type into the desired portions of the substrate. In one embodiment, n-type dopants are implanted into the p-type well used for n-channel devices, and p-type dopants are used for p-channel devices. An implant may also be performed to implant dopants into the channel region 213 between the diffusion regions to adjust the gate threshold voltage ($V_T$) of the transistor. Forming the diffusion regions after gate formation is also useful.

Various layers are deposited on the substrate and patterned to form a gate 214. The gate, for example, includes gate oxide and polycrystalline silicon (poly) layers. The poly is, for example, doped. In some cases, a metal silicide layer is formed over the doped poly, producing a polysilicon-silicide (polycide) layer to reduce sheet resistance. Various metal silicides, including molybdenum ($MoSi_x$), tantalum ($TaSi_x$), tungsten ($WSi_x$), titanium silicide ($TiSi_x$) or cobalt silicide ($CoSi_x$), are useful. Aluminum or refractory metals, such as tungsten and molybdenum, can be used alone or in combination with silicides or poly.

Contact plug 220 coupling diffusion region 211 to a bitline 225 and contact plug 240 coupled to diffusion region 212 can be formed after completion of the transistor using various known techniques such as, for example, single or dual damascene techniques. Reactive ion etch (RIE) techniques are also useful. A combination of damascene and etch techniques can also be used. The contact plugs comprise a conductive material such as doped poly or tungsten (W). Other conductive materials are also useful. The bitline, for example, comprises aluminum (Al) or other types of conductive materials. An ILD layer 260 isolates the different components of the memory cell.

Referring to FIG. 3b, the process continues to form the ferroelectric capacitor. A conductive electrode barrier layer 251 can be formed on the ILD layer 260, covering the plug 240. The electrode barrier layer prevents the passage of oxygen to the plug 240. The electrode barrier can also prevent or reduce the migration of atoms between the contact plug 240 and the subsequently formed electrode 253. The barrier layer comprises, for example, titanium nitride (TiN). Other materials such as $IrSi_xO_y$, $CeO_2/TiSi_2$, or $TaSiN_x$ are also useful.

In accordance with the invention, the ferroelectric layer is formed from an amorphous as-deposited layer or film. The amorphous film is annealed, transforming it into the ferroelectric layer. We have discovered that by forming the ferroelectric layer from an amorphous layer, a lower thermal budget is consumed by the ferro-anneal as compared to that of ferroelectric layer formed from conventional techniques. The lower thermal budget avoids or reduces excessive diffusion of one or more of the constituents of the ferroelectric layer and oxidation of the contacts.

The amorphous layer is processed to produce a ferroelectric layer in accordance with the invention. The amorphous layer comprises materials that can be transformed into a ferroelectric layer. In one embodiment, the amorphous layer comprises a Bi-based oxide ceramic. The Bi-based oxide ceramic comprises, for example, strontium bismuth tantalate (SBT) or a material derived from SBT (SBT derivative). The amorphous layer is annealed under appropriate conditions transforming it into a ferroelectric layer.

The amorphous film comprises a material which can be processed, for example by a ferro-anneal, to form a ferroelectric film. In one embodiment, the amorphous layer comprises a metal oxide ceramic material. Preferably, the amorphous layer comprises a Bi-based oxide ceramic material. More preferably, the amorphous layer comprises a Bi-based oxide ceramic material that can be processed to transform it into a ferroelectric.

The precursors react under the desired process conditions depositing a Bi-based oxide ceramic film on the substrate. In accordance with the invention, the Bi-based oxide ceramic film is deposited substantially in amorphous forms, without substantially any fluorite phase present. In one embodiment, the as-deposited film is amorphous as determined by x-ray diffraction (XRD). A (D/maxB XRD) system manufactured by Rigaku was used. The system was set up with a graphite curved crystal monochrometer and a Cu X-ray target.

Depositing an amorphous Bi-based oxide ceramic film without substantially any fluorite phase contradicts conventional wisdom, which suggests that the fluorite phase is crucial as an intermediate phase from which the deposited film is transformed into a ferroelectric. See for example Isobe et al., Integrated Ferroelectric, 1997, Vol. 14, pp.

95–103. There are several reasons why the fluorite phase is believed to important. It is believed that the fluorite phase serves to transport the as-deposited film up to the reaction temperatures required for the perovskite formation without phase separation, e.g., to prevent separation of the oxides during annealing. Additionally, the pre-arrangement of the atoms in a fluorite phase may facilitate a fast film transformation to the Aurivillius phase.

We have discovered that depositing an amorphous Bi-based oxide ceramic film without substantially any fluorite phase is advantageous. For example the amorphous film requires a lower thermal budget than conventional as-deposited films to transform it into the ferroelectric phase. Furthermore, ferroelectrics formed from amorphous films have better electrical characteristics than those formed from conventional techniques.

It is believed that the reason a lower thermal budget is needed to transform the amorphous precursor film into the ferroelectric phase is because amorphous films are more compositionally homogeneous than the fluorite-containing as-deposited films. Heterogeneous films such as the fluorite containing films require more time and higher temperature anneals because some atoms in these film have to move over longer distances. Other detrimental phases might be formed during the longer high temperature anneal in parts of the films with the wrong composition.

In contrast to the conventional as-deposited films, the substantially amorphous as-deposited film is relatively smooth with smaller or no features. The relatively smooth surface indicates that there is reduced Bi segregation during deposition, which produces a film that is more homogeneous in composition than conventional as-deposited films with fluorite phase. The surface morphology of XRD amorphous films is smooth with no or almost no features, indicating that the film is homogeneous in composition.

The amorphous nature of the Bi-based oxide ceramic film is affected by the deposition temperature. The Bi-based oxide ceramic is deposited at a temperature which produces a substantially amorphous film. In one embodiment, the deposition temperature is lower than 400° C., more preferably at about 330–390° C., more preferably at about 350–390° C., more preferably at about 360–380° C., more preferably at about 380° C. At temperatures less than 430° C., a substantially amorphous film is produced. It has been found, in one embodiment, that an XRD amorphous film is produced when deposited at temperatures of about 380° C. or less.

The deposition pressure of a reactor has also has been found to affect the amorphous nature of the deposited film. In one embodiment, the pressure at which the film is deposited produces a substantially amorphous film. The deposition pressure, for example, is about 0.1 to 760 torr, preferably greater than about 1 torr, more preferably about 1–20 torr, more preferably about 3–20 torr, more preferably about 5–20 torr, more preferably about 7–20 torr, more preferably about 7–12 torr, and more preferably about 8–10 torr. As the deposition pressure increases, formation of fluorite phase decreases.

The ferro-anneal transforms the amorphous film into a ferroelectric. A ferro-anneal at a temperature of about 600–830° C. for about 1–60 minutes, depending on the temperature, has been found to be sufficient to convert the amorphously deposited film to the ferroelectric Aurivillius phase. The higher the temperature of the anneal, the shorter the time required to transform the substantially amorphous film to the Aurivillius ferroelectric phase. For example, an anneal of about 5 minutes at 750° C. is sufficient to complete the transformation to the Aurivillius phase. A slightly longer anneal of about 10 minutes is sufficient to complete the transformation to the Aurivillius phase at about 700° C.

A conductive layer 253 is deposited over the electrode barrier layer. The conductive layer 253 serves as the bottom electrode. Preferably, the bottom electrode comprises a conductive material that does not react with the subsequently deposited metal oxide ceramic film. In one embodiment, the bottom electrode comprises a noble metal such as Pt, Pd, Au, Ir, or Rh. Other materials such as conducting metal oxides, conducting metal nitrides, or super conducting oxides are also useful. Preferably, the conducting metal oxides, conducting metal nitrides, or super conducting oxides do not react with the ferroelectric layer. Conducting oxides include, for example, $IrO_x$, $RhO_x$, $RuO_x$, $OsO_x$, $ReO_x$, or $WO_x$ (where x is greater than about 0 and less than about 2). Conducting metal nitrides include, for example, $TiN_x$, $ZrN_x$ (where x is greater than about 0 and less than about 1.1), $WN_x$, or $TaN_x$ (where x is greater than about 0 and less than about 1.7). Super conducting oxides can include, for example, $YBa_2Cu_3O_{7-x}$, $Bi_2Sr_2Ca_2Cu_3O_x$, or $Bi_2Sr_2Ca_1CU_2O_y$.

A metal oxide ceramic layer is formed above the conductive layer 253. The metal oxide ceramic comprises a ferroelectric phase or is capable of transformation into a ferroelectric. Various techniques, such as such as sol-gel, chemical vapor deposition (CVD), sputtering, pulsed laser deposition (PLD), and evaporation, are used to form the metal oxide ceramic layer. Preferably, the metal oxide ceramic layer is formed by CVD.

Preferably, the metal oxide ceramic is deposited by low temperature CVD techniques. Low temperature techniques are described in co-pending U.S. patent application Ser. No. 08/975,087, titled "Low Temperature CVD Process using B-Diketonate Bismuth Precursor for the Preparation of Bismuth Ceramic Thin Films for Integration into Ferroelectric Memory Devices," which is herein incorporated by reference for all purposes. More preferably, the metal oxide ceramic layer is deposited in amorphous form using CVD. CVD amorphously deposited metal oxide layers are described in co-pending U.S. patent application Ser. No. 09/107,861, titled "Amorphously Deposited Metal Oxide Ceramic Films" which is herein incorporated by reference for all purposes.

In one embodiment, the metal oxide ceramic comprises a Bi-based metal oxide ceramic. The Bi-based metal oxide layer is generally expressed by $Y_aBi_bX_2O_c$, where Y comprises a 2-valent cation and X comprises a 5-valent cation. In one embodiment, Y is equal to one or more elements selected from Sr, Ba, Pb, and Ca. X, in one embodiment, is equal to one or more elements selected from Ta and Nb. The subscript "a" refers to the number of Y atoms for every 2× atoms; subscript "b" refers to the number of Bi atoms for every 2× atoms; and subscript "c" refers to the number of oxygen atoms for every 2× atoms.

In one embodiment, the Bi-based oxide ceramic comprises Sr. A Bi-based oxide comprising Sr and Ta is also useful. Preferably, the Bi-oxide comprises SBT expressed generally by $Sr_aBi_bTa_2O_c$. The SBT can be more specifically expressed by, for example, the $SrBi_2Ta_2O_9$. The ferroelectric SBT comprises a layered perovskite structure having negatively charged perovskite layers of Sr and Ta oxide separated by positively charged Bi oxide layers. The stoichiometry of the Sr and Ta oxide is for example $[SrTa_2O_7]^{2n-}{}_n$, and the stoichiometry of the Bi oxide layers is for example $[Bi_2O_2]^{2n+}{}_n$, creating a structure of alternating $[SrTa_2O_7]^{2n-}{}_n$ and $[Bi_2O_2]^{2n+}{}_n$ layers.

Derivatives of SBT are also useful. SBT derivatives include $Sr_aBi_bTa_{2-x}Nb_xO_c$ ($0<x<2$), $Sr_aBi_bNb_2O_c$, $Sr_{a-x}Ba_xBi_bTa_{2-y}Nb_yO_c$ ($0 \leq x \leq 1$, $0 \leq y \leq 2$), $Sr_{a-x}Ca_xBi_bTa_{2-y}Nb_yO_9$ ($0 \leq x \leq a$, $0 \leq y \leq 2$), $Sr_{a-x}Pb_xBi_bTa_{2-y}Nb_yO_c$ ($0 \leq x \leq a$, $0 \leq y \leq 2$), or $Sr_{a-x-y-z}Ba_xCa_yPb_zBi_bTa_{2-p}Nb_pO_c$ ($0 \leq x+y+z \leq a$, $0 \leq p \leq 2$). Substituting or doping the Bi-based oxides or SBT derivatives with a metal of the lanthanide series is also useful.

In one embodiment, the Bi-based metal oxide ceramic is deposited by low temperature CVD techniques. In a preferred embodiment, the Bi-based metal oxide is deposited amorphously by CVD. The temperature at which the Bi-based metal oxide is deposited is, for example about 430° C. or less and preferably about 385–430° C.

Various techniques, such as such as sol-gel, chemical vapor deposition (CVD), sputtering, pulsed laser deposition (PLD), and evaporation, are used to form the metal oxide ceramic layer. Preferably, the metal oxide ceramic layer is formed by CVD. Preferably, the metal oxide ceramic is deposited by low temperature CVD techniques. Low temperature techniques are described in co-pending U.S. patent application Ser. No. 08/975,087, titled "Low Temperature CVD Process using B-Diketonate Bismuth Precursor for the Preparation of Bismuth Ceramic Thin Films for Integration into Ferroelectric Memory Devices," which is herein incorporated by reference for all purposes. More preferably, the metal oxide ceramic layer is deposited in amorphous form using CVD. CVD amorphously deposited metal oxide layers are described in co-pending U.S. patent application Ser. No. 09/107,861, titled "Amorphously Deposited Metal Oxide Ceramic Films" (attorney docket number 98P7422), which is herein incorporated by reference for all purposes.

The precursors can be individually dissolved in a solvent system and stored in a respective reservoir of the delivery subsystem. The precursors are mixed in the correct ratio prior to deposition. Mixing the precursors in a single reservoir is also useful. The precursors should be highly soluble in the solvent system. The solubility of the precursors in the solvent system is, for example, about 0.1–5M. Solubility of about 0.1–2M or about 0.1–1M is also useful.

In accordance with one embodiment of the invention, the composition of the Bi-based metal oxide is tailored to reduce diffusion of the mobile specie. The mobile specie of the Bi-based metal oxide ceramic comprises Bi such as, for example, Bi or $Bi_2O_3$. From experiments, it has been found that the composition of the Bi-based metal oxide ceramic layer influences the amount of mobile specie (Bi) that diffuses out of the layer. In particular, a Bi-based metal oxide ceramic layer comprising a composition having a Bi ratio to 2× (b in the formula $Y_aBi_bX_2O_c$) of greater than 2.4 results in significant Bi loss or diffusion.

In one embodiment, the Bi-based metal oxide ceramic comprises a composition wherein the value of b is less than or equal to 2.4 to reduce diffusion of the excess mobile specie. Preferably, the composition of the metal oxide ceramic layer comprises a value of b equal to about 1.95 to 2.2 and more preferably about 2.0 to 2.2.

The content of Y molecules also influence Bi loss from the Bi-based metal oxide ceramic. It is believed that decreasing that amount of Y atoms (e.g., Y deficient composition or where Y<1) provides additional sites for the Bi atoms to occupy, thereby reducing the amount of Bi that can diffuse out of the metal oxide ceramic layer. This is also advantageous as the resulting layer comprises a structure which produces good electrical properties. In one embodiment, the composition of the metal oxide ceramic layer comprises a Y to 2X ratio (a in the formula $Y_aBi_bX_2O_c$) of about 0.8 to 1.0. A composition wherein a is equal to about 0.9–1.0 has also been found to be useful in reducing the diffusion of the excess mobile specie and without degrading the electrical properties of the Bi-based metal oxide ceramic layer.

In a preferred embodiment, the Bi-based metal oxide ceramic comprises SBT. The SBT comprises a composition wherein a is less than or equal to about 2.4. In one embodiment, the composition of the SBT comprises a value of a of about 1.95 to 2.2, preferably about 2.0 to 2.2. The Sr to 2Ta (value of a) ratio of the SBT is about 0.8 to 1.0.

An anneal is performed after the formation of the metal oxide ceramic layer. The anneal transforms the as-deposited metal oxide ceramic into a layer having the desired electrical characteristics. In one embodiment, the anneal transforms the as-deposited metal oxide into the ferroelectric phase. The anneal also grows the grains of the ferroelectric phase to produce good electrical properties, such as high 2Pr. The anneal is typically performed at about 750–800° C. for about 1–30 minutes in an oxygenated ambient. Lower temperatures are also useful. For example, the anneal can be performed at about 650–750° C. Lower temperatures, however, may require a longer anneal (e.g., about 30–120 minutes) to achieve the desired electrical properties. The duration of the anneal can vary depending on the electrical properties desired.

A conductive layer 257 is deposited over the metal oxide ceramic layer to form the top electrode. The conductive layer comprises, for example, a noble metal such as Pt, Pd, Au, Ir, or Rh. Other materials such as those used to form the bottom electrode are also useful.

It is often useful to perform an anneal after the deposition of the top electrode to ensure that a well-defined interface is formed between the metal oxide ceramic and electrode. The anneal to recover the interface between the metal oxide ceramic and electrode can be typically performed at about 500–800° C. for about 1–30 minutes in oxygen ambient with $O_2$ flow rate of about 5 slm. Having a well-defined interface between the electrode and metal oxide ceramic is advantageous as this reduces, for example, leakage currents.

Performing a pre-anneal after the deposition of the metal oxide ceramic to partially or fully form the ferroelectric phase, and then performing another anneal after the deposition of the top electrode to fully transform the metal oxide ceramic into the ferroelectric phase if it has not already been fully transformed, to promote grain growth, and to ensure a well defined metal oxide ceramic/electrode interface can also be useful.

The pre-anneal typically is performed at a temperature of less than about 750° C. In one embodiment, the pre-anneal is performed at about 700–750° C. The duration of the pre-anneal is about 5–10 minutes. In another embodiment, the pre-anneal is performed at less than 700° C. At lower temperatures, a longer per-anneal may be required to partially or fully transform the metal oxide ceramic into the ferroelectric phase.

Figure 3C:
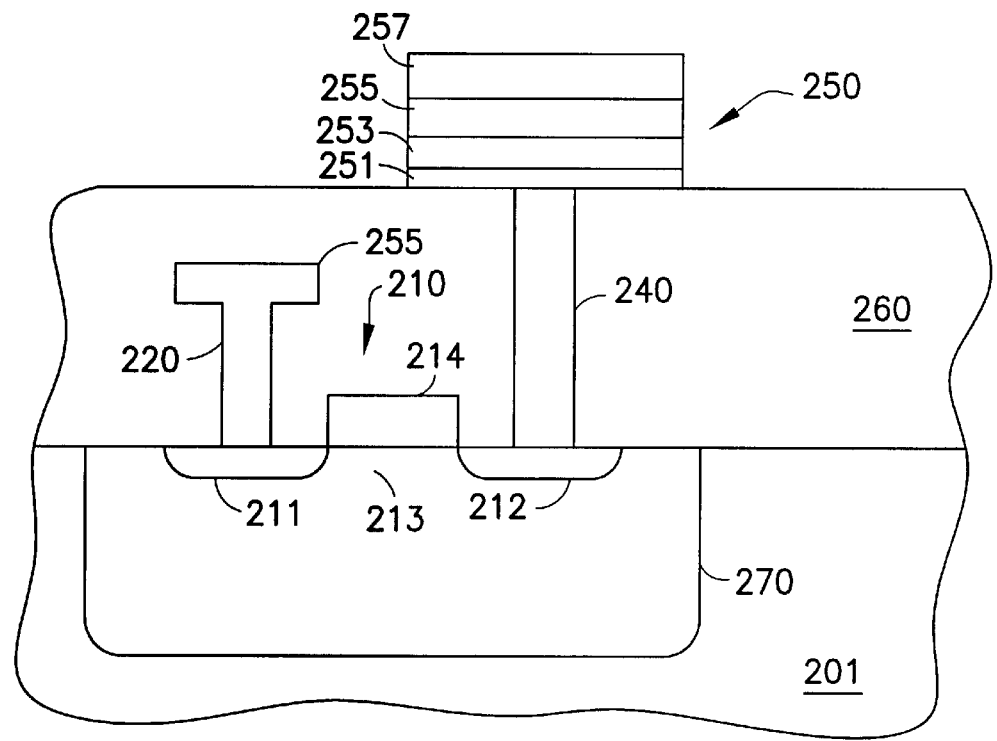

The various layers of the capacitor are masked and etched to form the capacitor 250, as shown in FIG. 3c. Additional processing is performed to complete the ferroelectric memory IC. Such additional processing is known in the art. For example, the additional processing includes forming support circuitry, final passivation layer, contact openings in the passivation layer for testing and connecting to lead frame, and packaging.

Figure 4:
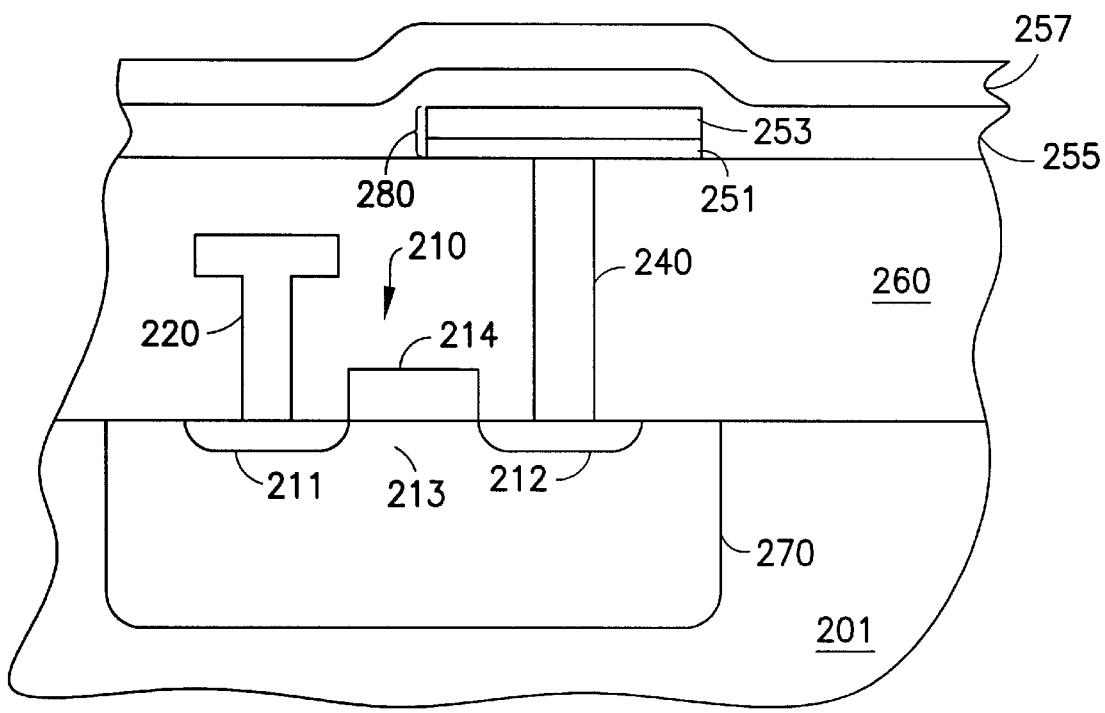
FIGS. 4–7 show processes for forming alternative embodiments of the invention.

FIG. 4 shows another embodiment of the invention. As shown, a substrate 201 comprises a partially formed memory cell as described in FIG. 3a. Similar reference numbers designate similar features.

A barrier layer 251 and conductive layer 253 serving as a bottom electrode are deposited on the ILD layer 260. The barrier layer and conductive layer are patterned to form a bottom electrode stack 280. The bottom electrode is coupled to the diffusion region 212 by contact plug 240.

A metal oxide ceramic layer 255 is formed over the bottom electrode and ILD layer. The metal oxide ceramic, in one embodiment, comprises a ferroelectric phase or is capable of transformation into a ferroelectric. As previously described, the composition and/or deposition parameters of the metal oxide ceramic can be tailored to reduce diffusion of the excess mobile specie.

An anneal is performed to transform the metal oxide ceramic into the desired phase with good electrical properties. A conductive layer 257 is deposited over the metal oxide layer to form the top electrode. An anneal can be performed after the deposition of the top electrode to ensure a well-defined interface between the metal oxide ceramic and electrode.

Alternatively, performing a pre-anneal after the deposition of the metal oxide ceramic to partially or fully form the ferroelectric phase, and then performing another anneal after the deposition of the top electrode to fully transform the metal oxide ceramic into the ferroelectric phase if it has not already been fully transformed, to promote grain growth, and to ensure a well defined metal oxide ceramic/electrode interface can also be useful.

The top electrode typically serves as a common electrode, connecting other capacitors in the memory array. The top electrode, along with the other layers underneath, can be patterned as necessary to provide contact openings to the bitlines and wordlines. Additional processing is performed to complete the ferroelectric memory IC.

In an alternative embodiment, the metal oxide ceramic layer 255 can be patterned to cover the bottom electrode stack 280, including the sides to provide isolation between the electrodes. Forming all the layers of the capacitor and patterning it to form the capacitor can also be useful.

Figure 5:
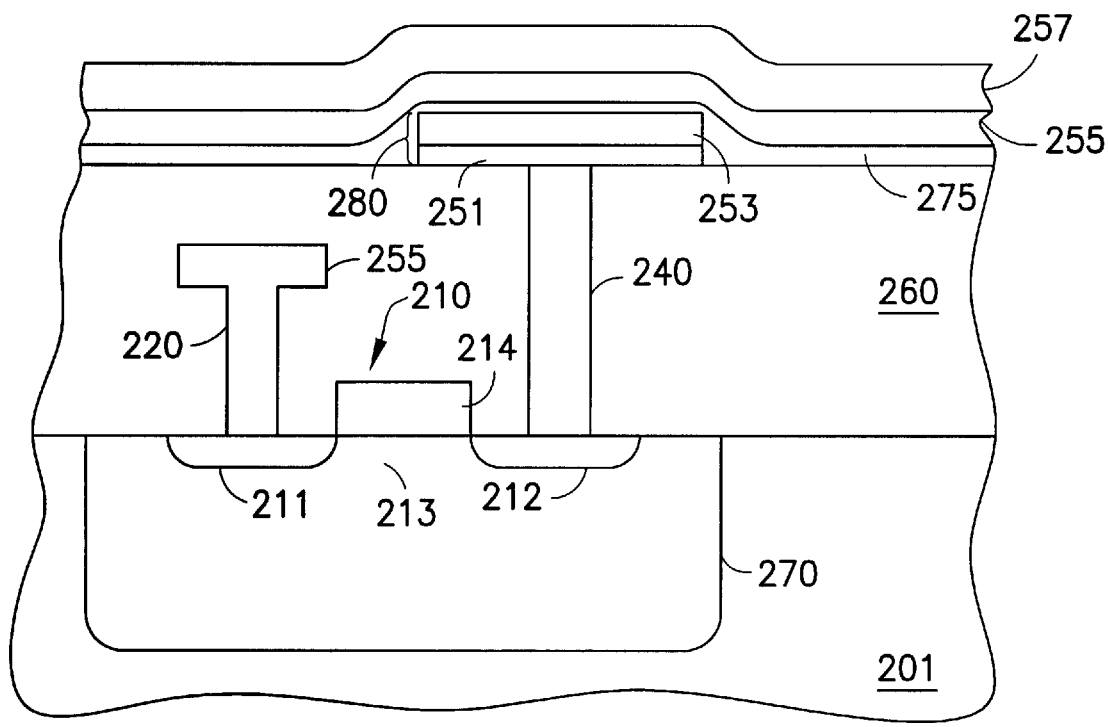

FIG. 5 shows another embodiment of the invention. As shown, a substrate 201 comprises a partially formed memory cell as described in FIG. 3a. Similar reference numbers designate similar features.

A barrier layer 251 and conductive layer 253 serving as a bottom electrode are deposited on the ILD layer 60. The barrier layer and conductive layer are patterned to form a bottom electrode stack 280. The bottom electrode is coupled to the diffusion region 212 via contact plug 240.

A compensation layer 275 is formed over the bottom electrode. The compensation layer comprises atoms or molecules of the mobile specie. For a Bi-based metal oxide ceramic, the compensation layer comprises Bi, such as Bi metal or Bi oxide. Oxide mixtures comprising the mobile specie can also be useful. For example, an oxide mixture such as $BiTi_xO_y$ can be used to serve as a compensation layer for a Bi-based metal oxide ceramic.

The Bi-containing compensation layer can be deposited by, for example, sputtering, physical vapor deposition, or CVD. Other techniques for depositing the compensation layer are also useful. CVD is particularly advantageous if the subsequently formed metal oxide ceramic layer 255 is also formed by CVD. For example, the deposition parameters such as pressure, temperature, oxygen content, or flow could be adjusted to provide additional Bi oxide at the initial phase of forming the Bi-metal oxide ceramic in order to form the compensation layer. Providing additional precursors of the mobile specie at the initial phase of the deposition process is also useful.

The metal oxide ceramic, such as a Bi-based metal oxide ceramic, is deposited over the compensation layer. The composition and/or process parameters of the metal oxide ceramic can be tailored, as previously described, to reduce diffusion of the excess mobile specie. An anneal transforms the as-deposited metal oxide ceramic to a layer having the desired electrical properties. During the anneal, the excess mobile specie diffuses out of the metal oxide ceramic. However, atoms or molecules of the mobile specie from the compensation layer migrate to the metal oxide ceramic to compensate for the loss of the mobile specie, ensuring that the metal oxide ceramic has the correct stoichiometry to achieve good electrical properties.

A conductive layer 257 is deposited over the metal oxide ceramic layer to form the top electrode. An anneal can be performed after the deposition of the top electrode to ensure a well define interface between the metal oxide ceramic and electrode.

Alternatively, performing a pre-anneal after the deposition of the metal oxide ceramic 255 to partially or fully form the ferroelectric phase, and then performing another anneal after the deposition of the top electrode to fully transform the metal oxide ceramic into the ferroelectric phase if it has not already been fully transformed, to promote grain growth, and to ensure a well defined metal oxide ceramic/electrode interface can also be useful. Additional processing is performed to complete the ferroelectric memory IC.

In an alternative embodiment, the compensation layer 275 acts as a seed layer to facilitate growth of the ferroelectric phase in the metal oxide ceramic. In one embodiment, the compensation layer comprises a crystal structure of the ferroelectric phase. A compensation layer comprising a cubic structure is also useful to facilitate the formation of the ferroelectric phase.

In one embodiment, the compensation layer comprises a material expressed generally as $ABO_3$. A is selected from the group comprising Ca, Sr, Ba, and Pb; B is selected from the group comprising Ti, Zr, and Hf. A compensation layer comprising $(Ba, Sr)TiO_3$, $SrTiO_3$, $Bi_3Ti_4O_{12}$, or $BaTiO_3$ is particularly useful. Such a compensation can be deposited by, for example, sputtering or CVD. Other techniques are also useful.

During the anneal that is used to transform the metal oxide ceramic into a ferroelectric with the desired electrical properties, the compensation provides nuclei of the ferroelectric phase. The nuclei facilitates the formation of the ferroelectric phase in the metal oxide ceramic to enhance its ferroelectric properties.

In an alternative embodiment, the metal oxide ceramic and compensation layers can be patterned to cover the bottom electrode, including the sides to provide isolation between the electrodes. The barrier, bottom electrode, and compensation layers can be formed on the ILD and patterned to form a bottom electrode. Also, forming all the layers of the capacitor and patterning it to form the structure 250 as described in FIGS. 3a–c can also be useful.

Figure 6:
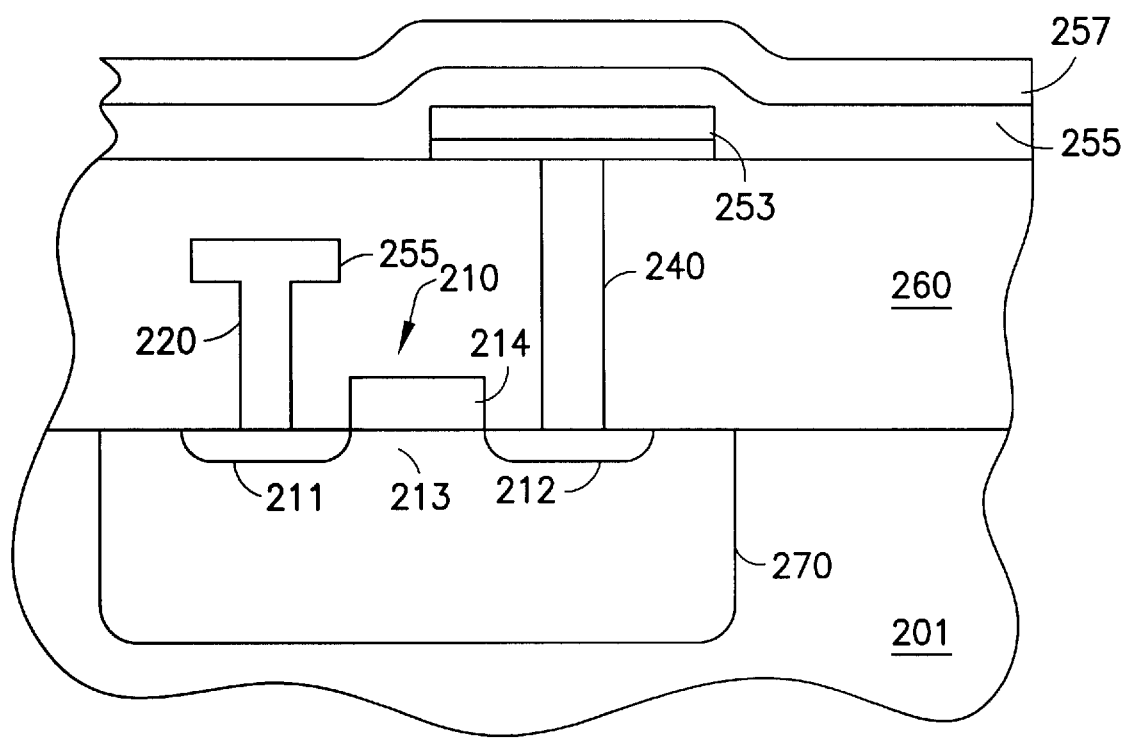

FIG. 6 shows another embodiment of the invention which reduces or suppresses the diffusion of the excess mobile specie into the substrate or unwanted regions of the device. As shown, a substrate 201 comprises a partially formed memory cell as described in FIG. 3a. Similar reference numbers designate similar features.

A conductive layer 253 is formed over the ILD layer 260. The conductive layer comprises a conductive material which blocks the diffusion of the excess mobile specie through it. The conductive material preferably does not react with the subsequently formed metal oxide ceramic 255. The conductive layer can be formed by, for example, sputtering, physical vapor deposition, or CVD. Other deposition processes for the conductive layer are also useful.

In one embodiment, the conductive material oxidizes during an anneal. The formed oxide can segregate from the base electrode material and fill the gaps between grain boundaries, thereby blocking the diffusion of the mobile specie. Also, the oxide can be integrated into the base electrode material, forming fully or highly miscible material which reacts to trap the excess mobile specie.

In one embodiment, the conductive layer comprises a base conductive material such as a noble metal. The noble metal includes, for example, Pt, Pd, Au, Ir, or Rh. The noble metal is combined with a metal that oxidizes during a thermal treatment (anneal) to form a conductive layer that suppresses the diffusion of the mobile specie. In one embodiment, the noble metal is combined with a metal selected from the group comprising Ti, Ta, Nb, W, Mo, Mg, Ca, Sr, Al, Ga, Ce, V, Cr, Mn, Fe, Co, and Ni. Combining the noble metal with other noble metals that undergo oxidation if exposed to oxygen is also useful. Such noble metals include, for example, Pd, Ir, Rh, Ru, Re, and Os.

In one embodiment, the conductive layer comprises a base conductive material such as a noble metal combined with one or more metals that form an oxide which segregates from the base electrode metal and fills the grain boundaries. The conductive layer comprises, for example, Pt combined with one or more metals selected from the group comprising Ir, W, Ru, Os, and Re. A conductive layer comprising Ir combined with one or more metals selected from the group comprising Pd, Pt, Re, and W can also be useful. Other conductive layers such as Rh combined with Re and Pd or Pd combined with Rh, Ru, and/or W are also useful.

In another embodiment, the bottom electrode comprises a noble metal combined with a metal that forms fully or highly miscible material. The bottom electrode, for example, comprises Pt combined with one or more metals selected from the group comprising Pd, Ir, Rh, Rem and Ru.

The conductive layer can be patterned to form the bottom electrode of the capacitor. A conductive electrode barrier layer (not shown) can optionally be deposited on the ILD 260 prior to the deposition of the conductive layer. The barrier provides an additional structure to reduce diffusion of the excess mobile specie into the substrate or unwanted regions of the device. The electrode barrier and conductive layers are patterned to form a bottom electrode stack.

A metal oxide ceramic is deposited over the conductive layer. The metal oxide ceramic comprises, for example, Bi having a composition and/or process parameters tailored to reduce diffusion of the excess mobile specie. An anneal is performed to transform the as-deposited metal oxide ceramic into a layer having the desired electrical characteristics. The anneal also oxidizes the conductive material, which results in blocking the diffusion pathway of the excess mobile specie and preventing it from diffusing into the substrate or plug.

A conductive layer 257 is deposited over the metal oxide ceramic layer to form the top electrode. An anneal can be performed after the deposition of the top electrode to ensure a well define interface between the metal oxide ceramic and electrode.

Alternatively, performing a pre-anneal after the deposition of the metal oxide ceramic to partially or fully form the ferroelectric phase, and then performing another anneal after the deposition of the top electrode to fully transform the metal oxide ceramic into the ferroelectric phase if it has not already been fully transformed, to promote grain growth, and to ensure a well defined metal oxide ceramic/electrode interface can also be useful. Additional processing is performed to complete the ferroelectric memory IC.

In an alternative embodiment, the metal oxide ceramic can be patterned to cover the bottom electrode or electrode stack, including the sides to provide isolation between the electrodes. Also, forming all the layers of the capacitor and patterning it to form a structure similar to structure 250 as described in FIGS. 3a–c can also be useful.

Figure 7:
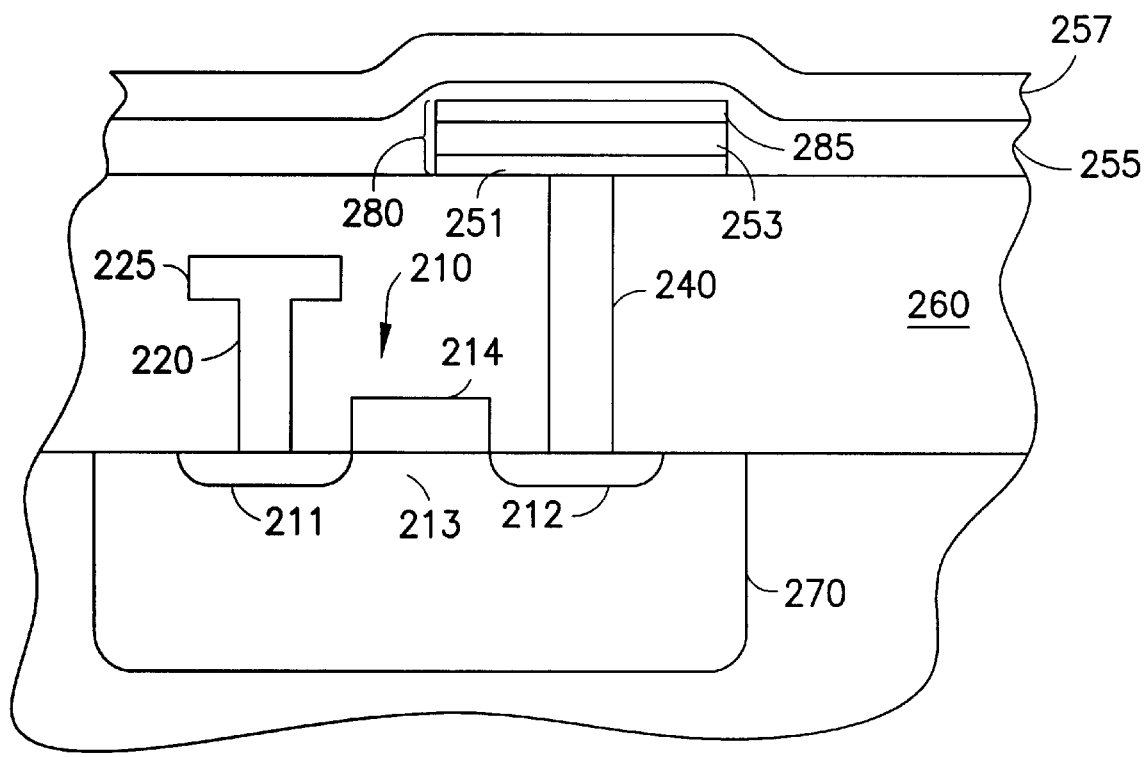

FIG. 7 shows another embodiment of the invention for reducing diffusion of the excess mobile specie into the substrate. As shown, a substrate 201 comprises a partially formed memory cell as described in FIG. 3a. Similar reference numbers designate similar features.

EXAMPLE 1

Bi-based oxide ceramic films comprising Sr and Ta were deposited on a silicon substrate. The substrate was processed to include a 635 nm thick silicon oxide. Above the silicon oxide is a 10 mm thick Ti adhesion layer and a 100 nm thick Pt layer. $Sr(thd)_2(pmdeta)$, $Bi(thd)_3$ and $Ta(thd)(O:Pr)_4$ precursors were used. The precursors were stored in solutions of a single metal/organic specie in a solvent comprising octane/decane/pmdeta in a 5:4:1 ration by volume. The concentration of $Sr(thd)_2(pmdeta)$ was 0.15M, $Bi(thd)_3$ was 0.3M, and $Ta(thd)(O:Pr)_4$ was 0.3M. Ar and $O_2$ were mixed with precursor vapors in a 4:6 ratio per volume. The as-deposited film comprises a Bi/2Ta ratio of about 1.8–2.2 and Sr/2Ta ratio of about 0.8–1.0.

The films were deposited under 5 different conditions of temperature, liquid delivery rate, and total gas flow, as listed in Table 1. Pressure was varied for the different conditions. The as-deposited films were analyzed to determine the film's thickness, composition, surface morphology, phase content, and Bi loss into the substrate during deposition. X-ray fluorescence (XRF) analysis was used to determine the thickness and composition of the films. Surface morphology was analyzed using SEM, AFM, and TEM. XRD and TEM were used to analyze the phase content of the as-deposited film. The surface morphology and XRD intensity of the fluorite phase of the as-deposited films are listed in Table 2.

TABLE 1

| Dep. Cond. | T [° C.] | Liquid delivery rate | Total gas flow [slm] |
|---|---|---|---|
| #1 | 430 | 0.1 | 10 |
| #2 | 430 | 0.2 | 1.6 |
| #3 | 430 | 0.1 | 1.6 |
| #4 | 380 | 0.2 | 10 |
| #5 | 380 | 0.2 | 1.6 |

TABLE 2

| Film # | Press. [Torr] | Dep. Cond. | Dep. Rate [nm/Min] | Morphology (SEM) | Fluorite |
|---|---|---|---|---|---|
| 1 | 3 | #1 | 3.1 | Islands | 90000 |
| 2 | 3 | #2 | 7.7 | Bumps | 6500 |
| 3 | 3 | #3 | 3.4 | Bumps | 1100 |
| 4 | 3 | #4 | 4.2 | Smaller Bumps | 400–700 |
| 5 | 3 | #5 | 5.8 | Smaller Bumps | 800–2200 |
| 6 | 5 | #1 | 3.1 | Bumps in High | 60000 |

TABLE 2-continued

| Film # | Press. [Torr] | Dep. Cond. | Dep. Rate [nm/Min] | Morphology (SEM) | Fluorite |
|---|---|---|---|---|---|
| 7 | 5 | #2 | 6.2 | Bumps | 20000 |
| 8 | 5 | #3 | 3.5 | Some Bumps | 800 |
| 9 | 5 | #4 | 5.1 | Fewer Smaller Bumps | 0–1300 |
| 10 | 5 | #5 | 6.5 | Fewer Smaller Bumps | 0 |
| 11 | 7 | #5 | 6.0 | Smooth | 0 |
| 12 | 9 | #1 | 2.8 | Bumps in High | 40000 |
| 13 | 9 | #2 | 3.1 | Bumps | 5500 |
| 14 | 9 | #3 | 2.7 | Small Bumps | 1400 |
| 15 | 9 | #4 | 4.7 | Smooth | 0 |
| 16 | 9 | #5 | 4.2 | Smooth | 0 |

XDR spectra of the as-deposited films formed by conditions 1–3 show peaks that can be correlated to a fluorite structure. Also, Bi rich features like bumps or islands were present, indicating Bi segregation. From Table 2, the intensity and size of the features decrease with decreasing deposition temperatures. A decrease in intensity and size of the features correlates with a decrease in Bi segregation. The intensity and size of the features decrease also with increasing deposition pressure as indicated by, for example, a comparison of films 1 and 6. The intensity and size of the features also decrease with increasing growth rates as indicated by, for example, a comparison of films 1 and 2.

The analysis of film 9 shows an almost smooth film with little fluorite phase formation. Increasing the deposition pressure to 9 torr results in a smooth XRD amorphous film with no fluorite phase as indicated by film 15. Also, depositing a film under the condition of film 10, 11, or 16 produces a smooth XRD amorphous film with no fluorite phase.

The transformation of substantially amorphous or XRD amorphous films into the ferroelectric phase was compared with conventional ferroelectrics formed from fluorite containing films. Experiments have shown that amorphous films were transformed completely into the ferroelectric Aurivillius phase after 5 minutes at 750° C. and after 10 minutes at 700° C. In contrast, a fluorite-containing film takes more than, for example, 10 minutes at 750° C. to convert into the ferroelectric phase. Thus, at a given temperature, the ferro-anneal used to transform the amorphous films into the ferroelectric phase is much quicker than that for fluorite films, consuming a lower thermal budget.

Experiments have also shown that at comparable annealing temperatures and duration, higher remnant polarization ($2P_r$) values were achieved in a shorter amount of time with SBT ferroelectrics formed from amorphous films than with those formed from fluorite films. For example, annealing the amorphous film at 800° C. for about 2.5 minutes and 5 minutes produced $2P_r$ values of 8.5 and 12.5 $\mu C/cm^2$, respectively. Annealing the amorphous film at 730° C. for about 10 minutes produced a $2P_r$ value of about 6.9 $\mu C/cm^2$. On the other hand, annealing a fluorite film at 730° C. for about 10 minutes produced a $2P_r$ value of only about $1 \mu C/cm^2$. A $2P_r$ value of about 8 $\mu C/cm^2$ was yielded after more that 60 minutes at 730° C. for the fluorite film.

A conductive layer 253 serving as a bottom electrode is deposited on the ILD layer 260. A barrier layer 285 is formed above the bottom electrode 253. The barrier layer, in accordance with one embodiment of the invention, reacts with the excess mobile specie, consuming it and preventing it from diffusing into unwanted regions of the device.

In a preferred embodiment, the barrier layer reacts with a mobile specie comprising Bi from a Bi-based metal oxide ceramic layer. The barrier layer comprises a material selected from the group comprising $TiO_2$, $Ta_2O_5$, SrO and $SrTa_xO_y$. Oxide mixtures such as $(Sr, Ba)TiO_3$ are also useful.

The conductive and barrier layers are patterned to form a bottom electrode stack 280. In another embodiment, a barrier layer 251 is formed prior to formation the conductive layer 253 to provide an additional structure to reduce diffusion of the excess mobile specie into unwanted regions of the device. The layers are patterned to form a bottom electrode stack 280.

A metal oxide ceramic is deposited over the bottom electrode. Preferably, the metal oxide ceramic layer comprises a Bi-based oxide ceramic deposited by, for example CVD. The composition and/or process parameters of the metal oxide ceramic can be tailored to reduce diffusion of the excess mobile specie. An anneal is performed to transform the as-deposited metal oxide ceramic into a layer having the desired electrical characteristics.

The anneal causes the excess mobile specie to diffuse out of the metal oxide ceramic and react with the barrier layer. The reaction consumes the excess mobile specie that diffuses to form a dense barrier layer which prevents additional addition excess mobile specie from diffusion through it. The barrier layer, after the reaction, preferably forms a paraelectric or ferroelectric layer to reduce or minimize its affect on the electric field applied to the ferroelectric layer 255. The barrier layer can also serve as a seed layer to facilitate formation of the desired phase in the metal oxide ceramic.

A conductive layer 257 is deposited over the metal oxide ceramic layer to form the top electrode. An anneal can be performed after the deposition of the top electrode to ensure the formation of a well-defined interface between the metal oxide ceramic and electrode.

Alternatively, performing a pre-anneal after the deposition of the metal oxide ceramic to partially or fully form the ferroelectric phase, and then performing another anneal after the deposition of the top electrode to fully transform the metal oxide ceramic into the ferroelectric phase if it has not already been fully transformed, to promote grain growth, and to ensure a well defined metal oxide ceramic/electrode interface can also be useful. Additional processing is performed to complete the ferroelectric memory IC.

In an alternative embodiment, the metal oxide ceramic can be patterned to cover the bottom electrode, including the sides to provide isolation between the electrodes. Also, forming all the layers and patterning them to form the capacitor can also be useful.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A process for fabricating a semiconductor device comprising:
    providing a substrate including a partially formed semiconductor device,
    forming a bottom electrode on the substrate;
    depositing by chemical vapor deposition at a temperature lower than 400° C. a substantially amorphous metal oxide ceramic layer over the bottom electrode, wherein the metal oxide ceramic comprises a composition tailored to reduce diffusion of excess mobile specie; and
    annealing the substantially amorphous metal oxide layer to convert the amorphous metal oxide layer to a ferroelectric layer.

2. The method as recited in claim 1 wherein the metal oxide ceramic comprises a Bi-based metal oxide ceramic expressed by $Y_aBi_bX_2O_c$, where Y comprises a 2-valent cation and X comprises a 5-valent cation.

3. The method as recited in claim 2 wherein Y comprises at least one element selected from the group comprising Sr, Ba, Pb, and Ca and X comprises at least one element selected from the group comprising Ta and Nb.

4. The method as recited in claim 2 wherein the Bi-based metal oxide ceramic comprises strontium bismuth tantalate (SBT) expressed generally by $Sr_aBi_bTa_2O_c$.

5. The method as recited in claim 2 wherein the metal oxide ceramic comprises a derivative of SBT.

6. The method as recited in claim 5 wherein the SBT derivative is selected from the group comprising $Sr_aBi_bTa_{2-x}Nb_xO_c(0<x<2)$, $Sr_aBi_bNb_2O_c$, $Sr_{a-x}Ba_xBi_bTa_{2-y}Nb_yO_c$ ($0 \leq x \leq a$, $0 \leq y \leq 2$), $Sr_{a-x}Ca_xBi_bTa_{2-y}Nb_yO_9$ ($0 \leq x \leq a$, $0 \leq y \leq 2$), $Sr_{a-x}Pb_xBi_bTa_{2-y}Nb_yO_c$ ($0 \leq x \leq a$, $0 \leq y \leq 2$), and $Sr_{a-x-y-z}Ba_xCa_yPb_zBi_bTa_{2-p}Nb_pO_c$ ($0 \leq x+y+z \leq a$, $0 \leq p \leq 2$).

7. The method as recited in claim 2 wherein the Bi-based oxide comprises a metal selected from the group comprising the lanthanide series.

8. The method as recited in claim 2 wherein the value of b is equal to or less than about 2.4 to reduce diffusion of the excess mobile specie.

9. The method as recited in claim 2 wherein the value of b is equal to about 1.95–2.2.

10. The method as recited in claim 2 wherein the value of b in the composition comprises a equal to about 2.0–2.2.

11. The method as recited in claim 9 wherein the metal oxide comprises a Y/2X ratio of about 0.8 to-1.0 to reduce diffusion of the excess mobile specie.

12. The method as recited in claim 9 wherein the value of a is equal to about 0.9–1.0.

13. The method as recited in claim 4 wherein the value of b in the SBT is equal to or less than about 2.4 to reduce diffusion of the excess mobile specie.

14. The method as recited in claim 4 wherein the value of b in the SBT is about 1.95–2.2.

15. The method as recited in claim 4 wherein the value of b of the SBT is about 2.0–2.2.

16. The method as recited in claim 14 wherein the SBT comprises a Sr/2Ta ratio of about 0.8 to 1.0 to reduce diffusion of the excess mobile specie.

17. The method as recited in claim 14 wherein the value of a of the SBT is about 0.9–1.0.

18. A process for fabricating a semiconductor device comprising:
   providing a substrate including a partially formed semiconductor device;
   forming a bottom electrode on the substrate; depositing a barrier layer over the bottom electrode, the barrier layer comprising a material selected from the group consisting of TiN, $IrSi_xO_y$, $CeO_2/TiSi_2$, $TaSiNxTiO_2$, $Ta_2O_5$, SrO and $SrTa_xO_y$;
   depositing a metal oxide ceramic layer over the barrier layer; and
   annealing the substrate to produce a ferroelectric layer with good electrical properties, wherein the annealing causes diffusion of an excess mobile specie from the metal oxide ceramic, and the excess mobile specie reacting with the material of the barrier layer to reduce diffusion of the excess mobile specie into the bottom electrode; and
   depositing a top electrode on the annealed substrate to form the semiconductor device.

19. The process as recited in claim 18 wherein the metal oxide ceramic comprises a Bi-based metal oxide ceramic.

20. The process as recited in claim 19 wherein the excess mobile specie comprises Bi.

21. The process as recited in claim 20 wherein the barrier layer comprises an oxide that reacts with the Bi-containing excess mobile specie.

22. The process as recited in claim 20 wherein the oxide is SrO.

23. A process for fabricating a semiconductor device comprising:
   providing a substrate including a partially formed semiconductor device;
   forming a bottom electrode on the substrate;
   depositing a Bi-compensation layer over the bottom electrode, the Bi-compensation layer selected from the group consisting of Bi metal and $Bi_2O_3$;
   depositing a Bi-metal oxide ceramic layer over the compensation layer, the metal oxide ceramic comprising a mobile specie; and
   annealing the substrate to produce a Bi-metal oxide ceramic with good electrical properties, wherein the anneal causes diffusion of an excess of the mobile specie from the metal oxide, and the Bi-compensation layer comprising the mobile specie replenishes the Bi-metal oxide ceramic with the mobile specie to ensure the Bi-metal oxide ceramic comprises a correct stoichiometry to produce good electrical properties.

24. The process according to claim 23 wherein the Bi-metal oxide ceramic layer is deposited at a temperature lower than 400° C. by chemical vapor deposition to form an amorphous metal oxide ceramic layer over the Bi-compensation layer.

25. The process according to claim 24 wherein the Bi-compensation layer is deposited at a temperature lower than 400° C. by chemical vapor deposition.

26. The process according to claim 18 wherein the metal oxide ceramic layer is deposited at a temperature lower than 400° C. by chemical vapor deposition to form an amorphous metal oxide ceramic layer over the barrier layer.

* * * * *